(12) United States Patent
Xi

(10) Patent No.: US 12,471,271 B2
(45) Date of Patent: Nov. 11, 2025

(54) SEMICONDUCTOR STRUCTURE AND METHOD FOR MANUFACTURING SAME, AND MEMORY

(71) Applicant: CHANGXIN MEMORY TECHNOLOGIES, INC., Hefei (CN)

(72) Inventor: Ning Xi, Anhui (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 529 days.

(21) Appl. No.: 17/954,734

(22) Filed: Sep. 28, 2022

(65) Prior Publication Data
US 2023/0189506 A1    Jun. 15, 2023

Related U.S. Application Data

(63) Continuation of application No. PCT/CN2022/094112, filed on May 20, 2022.

(30) Foreign Application Priority Data

May 13, 2022   (CN) .......................... 202210524411.5

(51) Int. Cl.
*H10B 12/00*  (2023.01)
*H10D 1/68*   (2025.01)

(52) U.S. Cl.
CPC .......... *H10B 12/33* (2023.02); *H10B 12/033* (2023.02); *H10B 12/036* (2023.02); *H10D 1/716* (2025.01)

(58) Field of Classification Search
CPC .... H10B 12/33; H10B 12/036; H10B 12/033; H10D 1/716
See application file for complete search history.

(56) References Cited

U.S. PATENT DOCUMENTS

| | | | |
|---|---|---|---|
| 10,103,169 B1 | 10/2018 | Ge | |
| 11,107,879 B2* | 8/2021 | Huang | .............. H01L 23/53295 |
| 2012/0214298 A1 | 8/2012 | Lim | |
| 2014/0065784 A1* | 3/2014 | Yoon | ........................ H10D 1/68 |
| | | | 438/381 |
| 2016/0379985 A1* | 12/2016 | Choi | ................. H01L 21/31111 |
| | | | 438/396 |

(Continued)

FOREIGN PATENT DOCUMENTS

| | | |
|---|---|---|
| CN | 100431155 C | 11/2008 |
| CN | 102751245 A | 10/2012 |

(Continued)

*Primary Examiner* — Jeff W Natalini
*Assistant Examiner* — Brandon C Fox
(74) *Attorney, Agent, or Firm* — Syncoda LLC; Feng Ma

(57) ABSTRACT

There are provided a semiconductor structure and a method for manufacturing the same, and a memory. The method for manufacturing a semiconductor structure includes: providing a stack structure including a first dielectric layer containing a first element; forming a first groove at least penetrating through the first dielectric layer by a first etching process, wherein after the first etching process, a first etch residue is formed in the first groove; forming a first protective layer covering a side wall, at the first dielectric layer, of the first groove; and performing a first cleaning on the stack structure formed with the first protective layer to remove the first etch residue. The first groove is configured for forming a storage cell.

7 Claims, 11 Drawing Sheets

(56) References Cited

U.S. PATENT DOCUMENTS

| | | | |
|---|---|---|---|
| 2022/0028966 A1* | 1/2022 | Wu | H10D 1/692 |
| 2022/0285481 A1* | 9/2022 | Zhan | H10D 1/042 |
| 2023/0006033 A1* | 1/2023 | Liu | H10D 1/043 |

FOREIGN PATENT DOCUMENTS

| | | |
|---|---|---|
| CN | 107305896 A | 10/2017 |
| CN | 111834197 A | 10/2020 |
| CN | 112466887 A | 3/2021 |
| TW | 564472 B | 12/2003 |
| TW | I263269 B | 10/2006 |

* cited by examiner

SEMICONDUCTOR STRUCTURE AND METHOD FOR MANUFACTURING SAME, AND MEMORY

CROSS-REFERENCE TO RELATED APPLICATIONS

This application is a continuation of International Patent Application No. PCT/CN2022/094112, filed on May 20, 2022, which claims priority to Chinese Patent Application No. 202210524411.5, filed on May 13, 2022. The disclosures of these applications are hereby incorporated by reference in their entirety.

BACKGROUND

A common storage array architecture of a Dynamic Random Access Memory (DRAM) is an array consisting of one transistor and one capacitor as a storage unit (i.e., a storage cell of 1T1C). The gate of the transistor is connected to a Word Line (WL), and the source/drain of the transistor has an end connected to a Bit Line (BL), and another end connected to the capacitor.

As the size of the DRAM becomes smaller and smaller, the size of the capacitor becomes smaller. How to ensure the performance of the capacitor with small size becomes an urgent problem to be solved.

SUMMARY

The present disclosure relates to the technical field of semiconductors, involves. but is not limited to, a semiconductor structure and a method for manufacturing the same, and a memory.

To solve the related technical problem, embodiments of the present disclosure provide a semiconductor structure and a method for manufacturing the same, and a memory.

A first aspect of the embodiments of the present disclosure provides a method for manufacturing a semiconductor structure, which may include the following operations.

A stack structure including a first dielectric layer containing a first element is provided.

A first groove at least penetrating through the first dielectric layer is formed by a first etching process. After the first etching process, a first etch residue is formed in the first groove.

A first protective layer covering a side wall, at the first dielectric layer, of the first groove is formed.

A first cleaning is performed on the stack structure for reed with the first protective layer to remove the first etch residue.

The first groove is configured for forming a storage cell.

A second aspect of the embodiments of the present disclosure provides a semiconductor structure, which may include: a substrate, multiple support layers, protective layers and storage cells.

The multiple support layers are located on the substrate and stacked and arranged at intervals in a first direction. Each of the support layers is provided with multiple through holes arranged according to a preset arrangement, and orthographic projections of corresponding through holes in the different support layers in the first direction overlap with each other.

The protective layers each are located on a part of a side wall of each of the through holes in the multiple support layers.

The storage cells are located in the through holes and penetrate through the multiple support layers.

The first direction is perpendicular to a surface of the support layer.

A third aspect of the embodiments of the present disclosure provides a memory, including: the semiconductor structure in any of the above embodiments of the present disclosure and a transistor array on a surface of the substrate. The storage cells in the semiconductor structure are connected to the transistor array.

BRIEF DESCRIPTION OF THE DRAGS

DESCRIPTIONS ABOUT THE REFERENCE SIGNS

Figure 1:
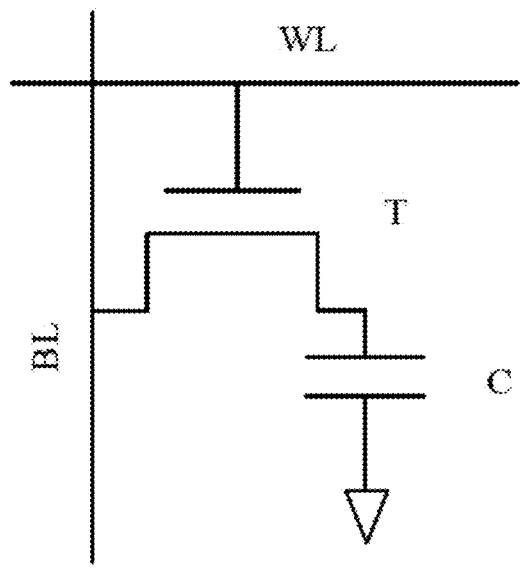
FIG. 1 is a schematic diagram of circuit connection of a DRAM transistor provided in an embodiment of the present disclosure.

20 denotes a stack structure; 201 denotes a through hole; 2011 denotes an upper area of the through hole; 2012 denotes a lower area of the through hole; 202 denotes a material layer containing boron; 203 denotes capacitor; 40 denotes a stack structure; 401 denotes a bottom dielectric layer; 402 denotes a first dielectric layer; 4021 denotes a first dielectric sublayer (bottom support layer); 4022 denotes a second dielectric sublayer; 403 denotes a second dielectric layer; 4031 denotes a middle support layer; 4032 denotes a sacrificial layer; 4033 denotes a top support layer; 404 denotes a pattern transfer layer; 405 denotes a first groove; 406 denotes a contact layer; 407 denotes a first protective layer; 4071 denotes a first protective sublayer; 4072 denotes a second protective sublayer; 408 denotes a first intermediate protective layer; 4081 denotes a first intermediate protective sublayer; 4082 denotes a second intermediate protective sublayer; 409 denotes a second protective layer; 4091 denotes a third protective sublayer; 4092 denotes a fourth protective sublayer; 410 denotes a storage cell; 4101 denotes a first conductive layer; 4102 denotes a dielectric medium layer; 4103 denotes a second conductive layer; and 411 denotes a fill layer.

In the accompanying drawings (not necessarily drawn to scale), the similar reference signs may describe the similar parts in different views. The similar reference signs with different suffix letters may represent different examples of the similar parts. The accompanying drawings generally show, by example rather than by limitation, the embodiments discussed in the present disclosure.

DETAILED DESCRIPTION

For making the technical solutions and advantages of the embodiments of the present disclosure clearer, the technical solutions of the present disclosure are further described in details below in combination with the accompanying drawings and the embodiments. Although the exemplary implementation modes of the disclosure are shown in the drawings, it should be understood that the disclosure may be implemented in various forums and shall not be limited by the implementation modes described here. Rather, these implementation modes are provided in order to have a more thorough understanding of the disclosure and to be able to fully convey the scope of the disclosure to those skilled in the art.

In the embodiments of the present disclosure, term "layer" refers to a material part that includes an area with thickness. The layer may extend over the whole of a lower or upper structure, or may have a scope smaller than the scope of the lower or upper structure. Moreover, the layer may be an area of a homogeneous or heterogeneous continuous structure whose thickness is less than that of a continuous structure. For example, the layer may be between the top surface and the bottom surface of the continuous structure, or the layer may be between any horizontal surface pair at the top surface and bottom surface of the continuous structure. The layer may extend horizontally, vertically and/or along an inclined surface. The layer may include multiple sub-layers. For example, an interconnection layer may include one or more conductors and contact sub-layers (which form interconnection wires and/or through-hole contacts), and one or more dielectric medium sub-layers.

Terms "first", "second" and the like in the embodiments of the present disclosure are adopted to distinguish similar objects and not intended to describe a specific sequence or order.

A semiconductor structure involved in the embodiments of the present disclosure is at least a part that will be used in the subsequent processing to form the structure of final device. Here, the final device may include a memory. The memory includes, but is not limited to, a. DRAM. The DRAM is only taken as an example for description below, but is not intended to limit the scope of the present disclosure.

With the development of the DRAM technology, the size of a storage cell becomes smaller and smaller, and its array architecture changes from $8F^2$ to $6F^2$, then to $4F^2$. In addition, based on the requirements for ions and leakage current in the DRAM, the architecture a the memory changes from a planar array transistor to a recess gate array transistor, from the recess gate array transistor to a buried channel array transistor, and then from the buried channel array transistor to a vertical channel array transistor.

In some embodiments of the present disclosure, no matter it is the planar array transistor or the vertical channel array transistor, the DRAM is composed of multiple storage cells. The structure of each storage cell is mainly composed of a transistor and a storage cell (capacitor) controlled by the transistor, that is, the DRAM includes the architecture of one Transistor (T) and one Capacitor W. (1T1C).

FIG. 1 is a schematic diagram of a control circuit using the architecture of 1T1C. provided in an embodiment of the present disclosure. As illustrated in FIG. 1, the drain of the transistor T is electrically connected to a bit line (BL), the source area of the transistor T is electrically connected to one electrode plate of the capacitor C, another electrode plate of the capacitor C may be connected to a reference voltage which may be a ground voltage or other voltages, and the gate of the transistor T is connected to a word line (WL). The voltage is applied through the WL to control the transistor T to be turned on or off. The BL is used to perform a read or write operation on the transistor T when the transistor T is turned on.

However, with the development of miniaturization of electronic products, there are still many problems in the process of forming a capacitor.

Figure 2:
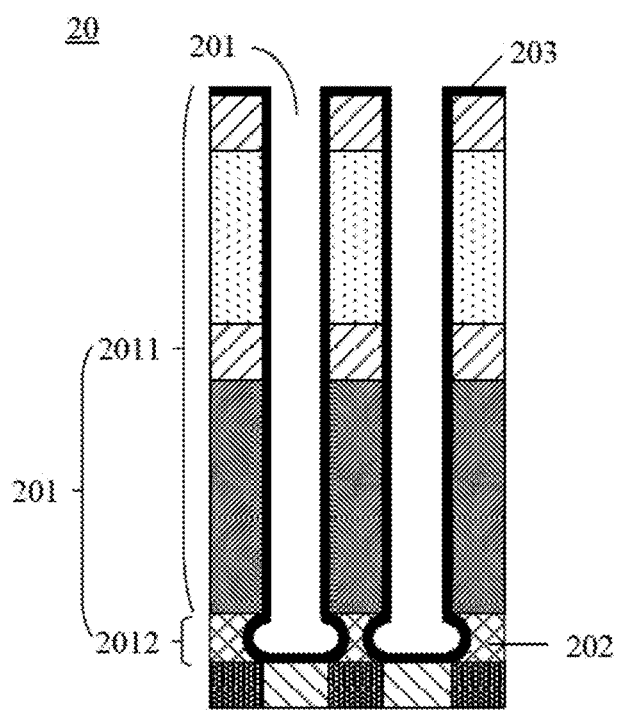
FIG. 2 is a section diagram of a through hole with different upper and lower diameter widths provided in an embodiment of the present disclosure.

Specifically, in the process of forming a capacitor, a through hole penetrating through a stack structure is usually, formed first, and then a capacitor covering the side wall, bottom, top, etc. of the through hole is formed in the through hole. In the process of forming the through hole, there will be an etch residue in the through hole, but when a cleaning solution is used to remove the etch residue, the cleaning solution produces a chemical reaction with part of the side wall of the through hole, which causes part of the side wall of the through hole to be removed, resulting in different upper and lower diameter widths of the through hole (for example, the diameter width of the upper area of the through hole 2011 is less than that of the lower area of the through hole 2012, referring to FIG. 2). As such, after the capacitor is formed in the through hole, there is a large difference in the morphologies of the upper area and the lower area of the capacitor, which seriously affects the performance of the capacitor and reduces the reliability of the memory. Here, the diameter width of the through hole may also be understood as a Critical Dimension (CD) of the through hole.

In some specific embodiments, the etch residue in the through hole is usually cleaned off using Dilute Sulfuric Peroxide Mixture (DSP) solution or Diluted Hydrofluoric Acid (DHF) solution. After cleaning, the diameter width of the upper area of the through hole is different from that of the lower area of the through hole, referring to FIG. 2.

It is understandable that the stack structure 20 includes a material layer 202 containing boron (B) element to reduce the difficulty of etching the bottom in manufacturing a structure with a depth-to-width ratio. However, when a first etch residue is cleaned off the DSP or DHF solution produces a chemical reaction with boron in the material layer 202, so that the side wall, at the material layer, in the through hole 201 is etched, that is, the diameter width of the through hole corresponding to the position of the material layer increases, and then the diameter width of the upper area of the through hole 2011 is different from that of the lower area of the through hole 2012.

Moreover, it is found from research that the higher the concentration of boron in the boron-containing material layer 202, the more the material layer is removed by the DSP or DHF solution, resulting in the greater the difference between the upper diameter width and the lower diameter width of the through hole.

In addition, before the through hole is cleaned by the DSP solution, plasma containing oxygen ($O_2$) is usually used to perform ashing on the stack structure to remove a photoresist or amorphous carbon hard mask. However, using the DSP solution to clean after performing, ashing using the plasma containing $O_2$, will increase an Etch Amount (EA) of the material layer 202 containing boron element.

In other words, the ashing process using the plasma of $O_2$ will further increase the amount of removal of SiBN, which will further increase the difference between the upper diameter width and the lower diameter width of the through hole.

Exemplarily, in some specific embodiments, the diameter width of the upper area of the through hole is 33.3 nm, the diameter width of the middle area of the through hole is 35.411m, and the diameter width of the lower area of the through hole is 28.2 nm. The difference between the diameter widths of the middle area of the through hole and the lower area of the through hole is about 7 nm.

Based on the difference between the upper diameter width and the lower diameter width of the through hole 201, the shapes of the upper part and the lower part of the capacitor 203 formed in the through hole 201 are quite different, which affects the performance of the capacitor and reduces the reliability of the memory.

Figure 3:
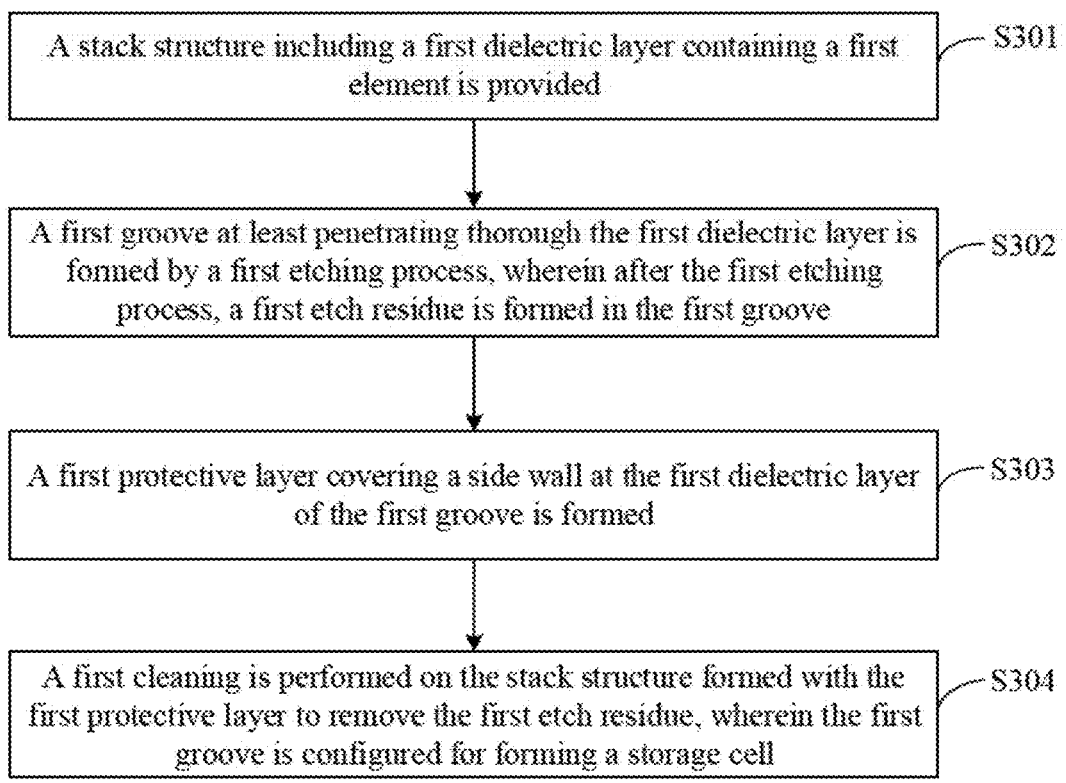
FIG. 3 is a flowchart of a method for manufacturing a semiconductor structure provided in an embodiment of the present disclosure.

In view of this, in order to solve one or more of the above problems, the embodiments of the present disclosure provide a method for manufacturing a semiconductor structure to improve the shape preserving ability of the storage cell (e.g., the capacitor), thereby improving the electrical performance of the storage cell (e.g., the capacitor) and thus improving the reliability of the memory. FIG. 3 is a flowchart of a method for manufacturing a semiconductor structure provided in an embodiment of the present disclosure. As illustrated in FIG. 3, the method for manufacturing a semiconductor structure provided in an embodiment of the present disclosure may include the following operations.

At S301, a stack structure including a first dielectric layer containing a first element is provided.

At S302, a first groove at least penetrating through the first dielectric layer is formed by a first etching process. After the first etching process, a first etch residue is formed in the first groove.

At S303, a first protective layer covering a side wall, at the first dielectric layer, of the first groove is formed.

At S304, a first cleaning is performed on the stack structure formed with the first protective layer to remove the first etch residue.

The first groove is configured for forming a storage cell.

It should be understood that the steps shown in FIG. 3 are not exclusive and additional steps may also be performed before and after any step or between any steps in the illustrated operations. The sequence of the steps shown in FIG. 3 may be adjusted according to actual needs. FIG. 4A to FIG. 4J are section diagrams illustrating a manufacturing process of a semiconductor structure provided in an embodiment of the present disclosure. The method for manufacturing, a semiconductor structure provided by the embodiments of the present disclosure is described in detail below in combination with FIG. 3 and FIG. 4A to FIG. 4J.

In S301, the stack structure 40 is provided.

Figure 4A:
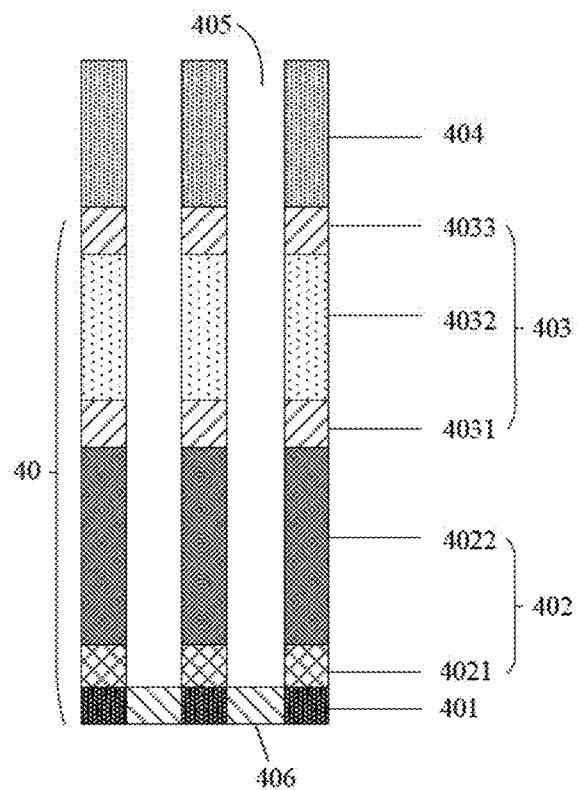
FIG. 4A to FIG. 4J are section diagrams illustrating a manufacturing process. of a semiconductor structure provided in an embodiment of the present disclosure.

Referring to FIG. 4A, the operation that the stack structure 40 is provided includes the following operation. A substrate Mot shown in FIG. 4A) is provided, and a bottom dielectric layer 401 is formed on the substrate. A first dielectric layer 402 containing a first element is formed on the bottom dielectric layer 401.

Here, materials for forming the substrate may include silicon (Si), germanium (Ge), silicon germanium (SiGe), and so on. In some other embodiments, materials for forming the substrate may also include Silicon on Insulator (SOI) or Germanium on Insulator (GOI). Here, the materials for forming the bottom dielectric layer 401 include, but are not hunted to, silicon nitride (SiN).

In some embodiments, the bottom dielectric layer 401 may be formed on the substrate by Physical Vapor Deposition (PVD), Chemical Vapor Deposition (CVD), Atomic Layer Deposition (ALD) and other ways.

Here, multiple contact layers 406 (e.g. contact layers of storage node) arranged at intervals are provided in the bottom dielectric layer 401.

The method may also include that: the contact layer 406 is formed in the bottom dielectric layer 401.

It is to be noted that there are several ways to form the bottom dielectric layer 401 and the contact layer 406. One of the ways includes that: an initial contact layer is formed on the surface of the substrate, and then multiple island-like contact layers 406 are formed by etching the initial contact layer; then, the bottom dielectric layer 401 is deposited at each of the gaps among the multiple contact layers 406. The top surface of the bottom dielectric layer 401 is basically flush with the top surface of the contact layer 406.

In some other embodiments, the bottom dielectric layer 401 and the contact layers 406 may also be formed by another way. Specifically, the bottom dielectric layer 401 is formed on the substrate first, and then the bottom dielectric layer 401 is etched to form multiple grooves (not shown in FIG. 4A) in the bottom dielectric layer 401: next, the contact layers 406 are formed in the grooves by a deposition process. The top surface of the bottom dielectric layer 401 is basically flush with the top surfaces of the contact layers 406.

It is understandable that, in the actual manufacturing process, the order of forming the bottom dielectric layer and the contact layer may be selected according to actual needs.

Here, the processes for forming the bottom dielectric layer 401 and the contact layer 406 include, but are not limited to, PVD, CVD, ALD, etc.

Next, the first dielectric layer 402 containing the first element is formed on the bottom dielectric layer 401 and the contact layer 406.

Here, the first element includes, but is not limited to, boron.

It is understandable that forming the first dielectric layer containing boron at the bottom of the stack structure may reduce the difficulty of etching the bottom when the stack structure is etched.

In some embodiments, the first dielectric layer 402 includes a first dielectric sublayer 4021 for forming a bottom support layer and a second dielectric sublayer 4022 on the first dielectric sublayer 4021. Both the first dielectric sublayer 4021 and the second dielectric sublayer 4022 contain the first element.

Here, materials for forming the first dielectric sublayer 4021 and the second dielectric sublayer 4022 may be the same or different.

Exemplarily, materials for forming the first dielectric sublayer 4021 include silicon boron nitrogen (SiBN), and materials for forming the second dielectric sublayer 4022 include borophosphosilicate glass (BPSG).

The operation that the first dielectric layer 402 containing the first element is formed on the bottom dielectric layer 401 includes the following operations.

The first dielectric sublayer 4021 is formed on the bottom dielectric layer 401.

The second dielectric sublayer 4022 is formed on the first dielectric sublayer 4021.

It is to be noted that the first dielectric sublayer plays a supporting role and is configured for forming the bottom support layer in the subsequent processes.

In some embodiments, the first dielectric sublayer 4021 and the second dielectric sublayer 4022 may also be formed on the bottom dielectric layer 401 by PVD, CVD, ALD and other ways.

In some embodiments, the stack structure also includes: a second dielectric layer 403 on the first dielectric layer 402. The method may also include forming the second dielectric layer 403 on the first dielectric layer 402.

Here, the second dielectric layer 403 includes a middle support layer 4031, a sacrificial layer 4032 on the middle support layer 4031 and a top support layer 4033 on the sacrificial layer 4032. In other words, the sacrificial layer 4032 is located between the middle support layer 4031 and the top support layer 4033.

Forming the second dielectric layer 403 on the second dielectric sublayer 4022 includes the following operations.

The middle support layer 4031 is formed on the second dielectric sublayer 4022.

The sacrificial layer 4032 is formed on the middle support layer 4031.

The top support layer 4033 is formed on the sacrificial layer 4032.

Here, the middle support layer 4031 and the top support layer 4033 may play a supporting role, and the sacrificial layer 4032 may be used to reduce stress.

In some embodiments, materials for forming the middle support layer 4031 and the top support layer 4033 may be the same or different.

Here, in order to improve the efficiency of the process, the materials for forming the middle support layer 4031 and the top support layer 4033 are the same.

Exemplarily, the materials for forming the middle support layer 4031 and the top support layer 4033 include, but are not limited to, silicon carbonitride (SiCN).

Materials for forming the sacrificial layer 4032 include, but are not limited to, tetraethyl orthosilicate (TEOS).

The methods for forming the middle support layer 4031, the sacrificial layer 4032 and the top support layer 4033 include, but are not limited to, PVD, CVD, ALD and so on.

It is to be noted that the materials for forming the first dielectric sublayer (the bottom support layer) 4021, the middle support layer 4031 and the top support layer 4033 may be the same or different. Specific materials may be selected and set according to actual needs.

In some embodiments, referring to FIG. 4A, the method may also include forming a pattern transfer layer 404 on the stack structure 40.

Here, the pattern transfer layer 404 is formed on the top support layer 4033. Selecting materials for forming the pattern transfer layer 404 needs to satisfy that an etch selectivity ratio of the pattern transfer layer 404 is different from each of etch selectivity ratios of the support layers (4021, 4031 and 4033) and an etch selectivity ratio of the sacrificial layer 4032.

In some embodiments, materials for forming the pattern transfer layer 404 include polysilicon (Poly). Moreover, the thickness of the pattern transfer layer 404 needs to be relatively thick. In this way, on the one hand, the pattern transfer layer 404 may be used as a mask for the first etching process performed on the stack structure; on the other hand, when the first etching process is performed on the stack structure, the pattern transfer layer 404 may protect the top support layer 4033 from excessive consumption, so as to facilitate the shape preservation of the top support layer 4033.

Here, the first etching process is described later and will not be repeated here.

Here, the methods for forming the pattern transfer layer 404 include, but are not limited to, PVD, CVD, ALD and so on.

In S302, a first groove 405 is formed, referring to FIG. 4A.

The operation that the first groove 405 is formed includes the following operation. By performing the first etching process on the stack structure 40 and the pattern transfer layer 404, the first groove 405 penetrating through the pattern transfer layer 404, the top support layer 4033, the sacrificial layer 4032, the middle support layer 4031, the second dielectric sublayer 4022, the first dielectric sublayer 4021 and the bottom dielectric layer 401 is formed.

The first etching process includes, but is not limited to, dry plasma etching.

Here, the first dielectric sublayer penetrated by the first groove 405 may also be referred to as the bottom support layer.

It is to be noted that the first groove 405 is connected to the contact layer 406.

It is to be noted that after the first etching process is performed, there is a first etch residue in the first groove 405.

Because the first etch residue may reduce the reliability of the memory or affect the electrical performance of the memory it is necessary to clean off the first etch residue in the first groove 405 after the first etching process is performed.

In the embodiments of the present disclosure, in order to prevent the cleaning solution (the DSP or DHF solution) from etching part of the side wall in the first groove to cause increase of the diameter width of partial region of the first groove, in 4303, before cleaning is performed, a first protective layer 407 is formed on a side wall, at the first dielectric, layer 402, of the first groove 405.

Figure 4B:
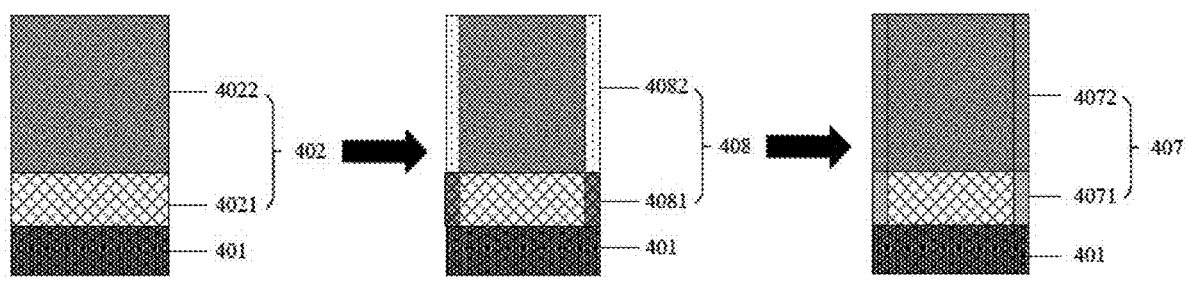
Figure 4C:
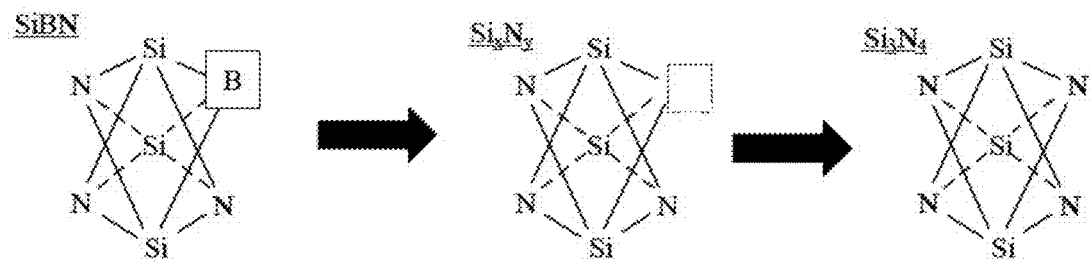
Figure 4D:
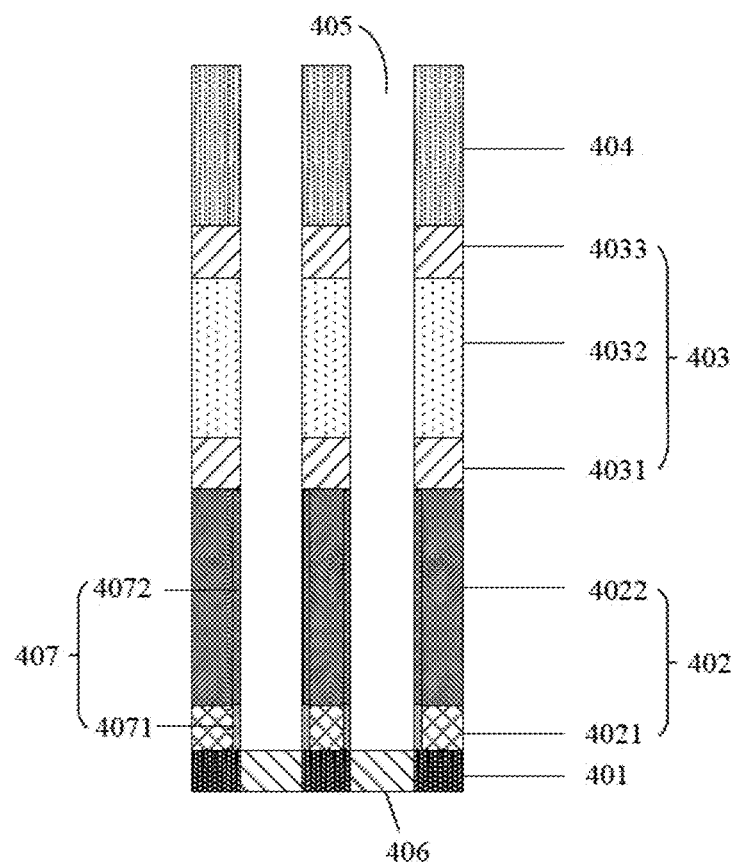

In some embodiments, referring to FIG. 4B, FIG. 4C and FIG. 4D, the operation that the first protective layer 407 is formed includes the following operations.

Before cleaning is performed, a first cleaning agent is used to perform first preprocessing on the first groove, so as to generate a first intermediate protective layer 408 on a surface of the first dielectric layer.

Plasma containing a second element is used to perform second preprocessing on the first groove formed with the first intermediate protective layer 408, so that the first intermediate protective layer 408 is changed into the first protective layer 407.

Here, the first cleaning agent includes Caro's acid solution or deionized water whose temperature is higher than a preset temperature. The second element includes nitrogen.

It is understandable that the Caro's acid solution includes perozymonosulfuric acid ($H_2SO_5$). In some specific embodiments, the Caro's acid solution may be produced by mixing sulfuric acid solution ($H_2SO_4$), with hydrogen peroxide ($H_2O_2$).

Here, the preset temperature is 80'C.

It is to be noted that the deionized water whose temperature is higher than the preset temperature may be understood as the temperature of the deionized water provided itself is higher than the preset temperature, and may also be understood as the temperature of the deionized water provided is lower than the preset temperature, but heat is released during the chemical reaction of the deionized water with boron, and the heat causes the temperature of the deionized water to rise to be higher than the preset temperature.

Here, the first preprocessing includes that the first cleaning agent produces a chemical reaction with the side wall of the first dielectric layer 402 in the first groove 405 to generate the first intermediate protective layer 408.

The second preprocessing includes that secondary processing is performed on the first intermediate protective layer 408 through the plasma containing nitrogen, so that the plasma containing nitrogen produces a chemical reaction with the first intermediate protective layer 408 to generate the first protective layer 407.

Here, the first protective layer 407 has a smooth and continuous side, referring to FIG. 4D.

It is to be noted that referring to FIG. 4A, the first dielectric layer 402 includes the first dielectric sublayer (the bottom support layer) 4021 and the second dielectric sublayer 4022 where the material forming the second dielectric sublayer is different from the material forming the first dielectric sublayer, and thus when the Caro's acid solution or the deionized water whose temperature is higher than the preset temperature produces a chemical reaction with the first dielectric layer 402, the first dielectric sublayer (the bottom support layer) 4021 and the second dielectric sublayer 4022 respectively produce different chemical reactions with the Caro's acid solution or the deionized water whose temperature is higher than the preset temperature to form the protective layers of different materials.

That is, referring to FIG. 4B, the first protective layer 407 includes a first protective sublayer 4071 generated by reaction of the first dielectric sublayer (the bottom support layer) 4021 with the Caro's acid solution (or the deionized water whose temperature is higher than the preset temperature) and a second protective sublayer 4072 generated by reaction of the second dielectric sublayer 4022 with the Caro's acid solution (or the deionized water whose temperature is higher than the preset temperature).

In some embodiments the first protective layer 407 includes the first protective sublayer 4071 and the second protective sublayer 4072; and correspondingly, the first intermediate protective layer 408 includes a first intermediate protective sublayer 4081 and a second intermediate protective sublayer 4082.

In some embodiments, materials for forming the first sub-protective layer 4071 include silicon nitride; materials for forming the second protective sublayer 4072 include silicon oxynitride; materials for forming the first intermediate protective sublayer 4081 include silicon nitride with unsaturated bonds; and materials for forming the second intermediate protective sublayer 4082 include undoped silicate glass.

In order to describe clearly the process of forming the first protective sublayer 4071 and the second protective sublayer 4072 when the first cleaning agent involves different solutions, the corresponding process is described in detail in the following embodiments when the first cleaning agent is the Caro's acid solution and the first cleaning agent is the deionized water whose temperature is higher than the preset temperature respectively.

In some embodiments, referring to FIG. 4B, when the first cleaning agent is the Caro's acid solution, the first preprocessing stage is as follows.

The Caro's acid solution produces a first chemical reaction with the first dielectric sublayer 4021 to generate the first intermediate, protective sublayer 4081; and the Caro's acid solution produces a second chemical reaction with the second dielectric, sublayer 4022 to generate the second intermediate protective sublayer 4082.

Here, the equation for the first chemical reaction is $SiBN+H_2SO_5 \rightarrow Si_xN_y$ (unstable silicon nitride), where exemplarily, $x=y$. In other words, $Si_xN_y$ has unsaturated bonds and thus has unstable chemical property. Here. $Si_xN_y$ is the first intermediate protective sublayer 4081 referring to FIG. 4C.

The equation for the second chemical reaction is $BPSG+H_2SO_5 \rightarrow USG$ (undoped silicate glass). Here, USG is the second intermediate protective sublayer 4082.

Exemplarily, a thickness of the first intermediate protective sublayer 4081 is about 1 nm, and a thickness of the second intermediate protective sublayer 4082 is about 1 nm.

In addition, after the first preprocessing, there is still a small amount of water vapor containing boron element and phosphorus element in the first groove 405. Next, referring to FIG. 4B, the water vapor containing boron element and phosphorus element in the first groove 405 is removed by the second preprocessing.

Next, the second preprocessing stage is as follows.

The plasma containing nitrogen element produces a third chemical reaction with the first intermediate protective sublayer 4081 to generate the first protective sublayer 4071, and the plasma containing nitrogen element produces a fourth chemical reaction with the second intermediate protective sublayer 4082 to generate the second protective sublayer 4072.

Here, gas sources of the plasma containing nitrogen element include hydrogen and nitrogen ($H_2+N_2$), ammonia ($NH_3$), or nitrogen ($N_2$).

The equation for the third chemical reaction is $Si_xN_y \pm H_2N_2/NH_3/N_2 \rightarrow Si_3N_4$ (silicon nitride). The chemical bonds of Si and N in $Si_3N_4$ are saturated and its chemical property is stable. Here, $Si_3N_4$ is the first protective sublayer 4071, referring to FIG. 4C.

The equation for the fourth chemical reaction is $USG+H_2N_2/NH_3/N_2 \rightarrow SiON$. Here, SiON is the second protective sublayer 4072.

Exemplarily, a thickness of the first protective sublayer 4071 is about burr, and a thickness of the second protective sublayer 4072 is about 1 nm.

In some embodiments, when the first cleaning agent is the deionized water whose temperature is higher than the preset temperature, the first preprocessing stage is as follows.

Referring to FIG. 4B, the deionized water produces the first chemical reaction with the first dielectric sublayer 4021 to generate the first intermediate protective sublayer 4081; and the deionized water produces the second chemical reaction with the second dielectric sublayer 4022 to generate the second intermediate protective sublayer 4082.

The equation for the first chemical reaction is $SiBN+H_2O \rightarrow Si_xN_y$, and $B+H_2O \rightarrow H_3BO_3$ (boric acid), where exemplarily, $x=y$. In other words, $Si_xN_y$ has unsaturated bonds and thus has unstable chemical property, referring to FIG. 4C. Here, $Si_xN_y$ is the first intermediate protective sublayer. In the subsequent processes, the boric acid is washed with the deionized water.

The equation for the second chemical reaction is, in BPSG, $B+H_2O \rightarrow H_3BO_3$ (boric acid), $P+H_2O \rightarrow H_3PO_4$ (phosphoric acid), and the remaining USG (undoped silica glass). Here, USG is the second intermediate protective sublayer 4082. In the subsequent processes, the boric acid and the phosphoric acid are washed with the deionized water.

Exemplarily, a thickness of the first intermediate protective sublayer 4081 is about 1 nm, and a thickness of the second intermediate protective sublayer 4082 is about 1 nm.

Next, the second preprocessing stage is as follows.

Referring to FIG. 4B, the plasma containing nitrogen element produces the third chemical reaction with the first intermediate protective sublayer 4081 to generate the first protective sublayer 4071; and the plasma containing nitrogen element produces the fourth chemical reaction with the second intermediate protective sublayer 4082 to generate the second protective sublayer 4072.

Here, gas sources of the plasma containing nitrogen element include hydrogen and nitrogen ($H_2+N_2$), ammonia ($NH_3$), or nitrogen ($N_2$).

The equation for the third chemical reaction is $Si_xN_y + H_2N_2/NH_3/N_2 \rightarrow Si_3N_4$. Here, $Si_3N_4$ is the first protective sublayer.

The equation for the fourth chemical reaction is $USG + H_2N_2/NH_3/N_2 \rightarrow SiON$. Here, SiON is the second protective sublayer 4072.

Exemplarily, a thickness of the first protective sublayer 4071 is about 1 nm and a thickness of the second protective sublayer 4072 is about him.

Figure 4E:
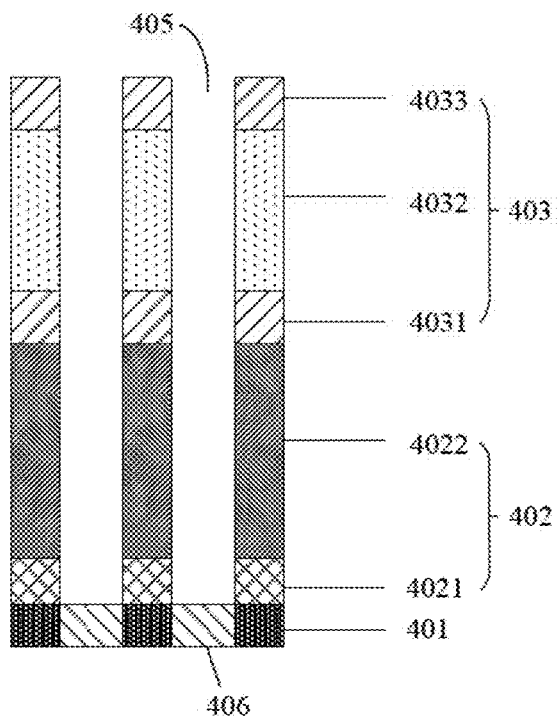

Here, in S304, referring to FIG. 4E, the first cleaning is performed on the stack structure formed with the first protective sublayer 4071 and the second protective sublayer 4072 to remove the first etch residue.

Here, the first cleaning may be understood as cleaning off the first etch residue in the first groove 405 by the DSP or DEW solution.

In the first groove 405, the first protective sublayer 4071 is formed on the side wall at the first dielectric sublayer 4021, and the second protective sublayer 4072 is formed on the side wall at the second dielectric sublayer 4022, so that the DSP or DHF solution does not contact the first dielectric sublayer 4021 and the second dielectric sublayer 4022 in the first groove 405 in the first cleaning process, thereby preventing the DSP or DHF solution from producing chemical reactions with the first dielectric sublayer 4021 and the second dielectric sublayer 4022. That is, in the first cleaning process, the diameter width of the first groove 405 does not increase, so that the upper and lower diameter widths of the first groove 405 are basically the same.

Further, in the subsequent processes, a capacitor is formed in the first groove 405 with basically the same upper and lower diameter widths, and the upper and lower diameter widths of the capacitor are also basically the same, which improves the shape preserving ability and the performance of the capacitor.

Figure 4F:
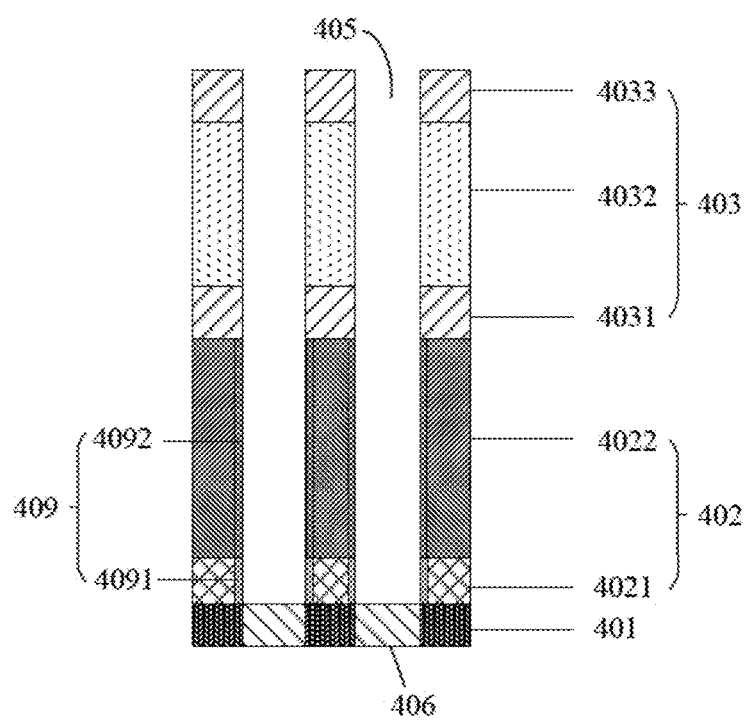

In some embodiments, referring to FIG. 4E and FIG. 4F. after the first etch residue is removed, the pattern transfer layer is removed by a second etching process. After the second etching process, a second etch residue is formed in the first groove.

After the second etching process, a second protective layer 409 is formed. The second protective layer 409 covers the side wall, at the first dielectric layer 402, of the first groove.

Second cleaning is performed on the stack structure formed with the second protective layer 409 to remove the second etch residue.

Here, the second etching process includes, but is not limited to, dry plasma etching.

In the embodiments of the present disclosure, after the second etching process, a second etch residue is formed in the first groove 405. The second etch residue is the same, as the first etch residue.

It is to be noted that, when the pattern transfer layer 404 is removed, the first protective layer 407 may not be removed, and still cover the side wall at the first dielectric layer 402 in the first groove or the first protective layer 407 may be removed together to expose the side wall at the first dielectric layer 402 in the first groove.

Exemplarily, in the case that the first protective layer 407 is not removed, the first groove 405 may be cleaned directly by the cleaning solution (the DSP or DHF solution), to remove the second etch residue, after the second etching process.

Exemplarily, in the case that the first protective layer 407 is removed together with the pattern transfer layer 404, there is a problem that the side wall, at each of the first dielectric sublayer 4021 and the second dielectric sublayer 4022, of the first groove 405 are etched when the first groove 405 is cleaned by the cleaning solution (the DSP or DHF solution), after the second etching process.

It is to be noted that even if the first protective layer 407 is removed together with the pattern transfer layer 404, because the thickness of the first protective layer 407 is small (e.g. 1 nm), the consistency of the upper and lower diameter widths of the first groove 405 is not substantially affected, and thus the effect can be ignored. Based on this, after the first protective layer 407 is removed together with the pattern transfer layer 404, the upper and lower diameter widths of the first groove 405 are basically the same.

Based on this, in order to avoid the problem that after the first protective layer 407 is removed, the first dielectric layer 402 is etched when the first groove is cleaned, in the embodiments of the present disclosure, after the second etching process, the second protective layer 409 is formed on the side wall, at the first dielectric layer 402, of the first groove 405, referring to FIG. 4F.

Here, the second protective layer 409 has a smooth and continuous side.

In some embodiments, the operation that the second protective layer is formed includes the following operations.

Before cleaning is performed, the first cleaning agent is used to perform the first preprocessing on the first groove, so as to generate a second intermediate protective layer (not shown in FIG. 4F) on the surface of the first dielectric layer.

Plasma containing a second element is used to perform second preprocessing on the first groove formed with the second intermediate protective layer, so that the second intermediate protective layer is changed into the second protective layer.

In some embodiments, the second protective layer 409 includes a third protective sublayer 4091 and a fourth protective sublayer 4092. Correspondingly, the second intermediate protective layer includes a third intermediate protective sublayer and a fourth intermediate protective sublayer.

Here, the operation that the second protective layer 409 is formed includes the following operation.

The third protective sublayer 4091 covering the first dielectric sublayer in the side wall of the first groove is formed, and the fourth protective sublayer 4092 covering the fourth dielectric sublayer in the side wall of the first groove is formed.

Here, the first cleaning agent includes Caro's acid solution or deionized water whose temperature is higher than a preset temperature. The second element includes nitrogen.

Specifically, the Caro's acid solution or the deionized water whose temperature is higher than the preset temperature is introduced into the first groove 405 by a wet etching process, so that the Caro's acid solution or the deionized water whose temperature is higher than the preset temperature produces a reaction with the first dielectric sublayer 4021 to generate the third intermediate protective sublayer, and produces a reaction with the second dielectric sublayer 4022 to generate the fourth intermediate protective sublayer.

Next, the second preprocessing is performed on the first groove 405 using the plasma containing nitrogen; that is, the plasma containing nitrogen produces a reaction with the third intermediate protective sub layer to form the third protective sublayer 4091; and the plasma containing nitrogen produces a reaction with the fourth intermediate protective sublayer to form the fourth protective sublayer.

It is to be noted that the methods for forming the third protective sublayer 4091 and the first protective sublayer 4071 are the same, and the methods for forming the fourth protective sublayer 4092 and the second protective sublayer 4072 are the same. The methods have been mentioned above and will not be repeated here.

Here, materials for forming the third protective sublayer 4091 include silicon oxynitride, and materials for forming the fourth protective sublayer 4092 include silicon nitride.

Figure 4G:
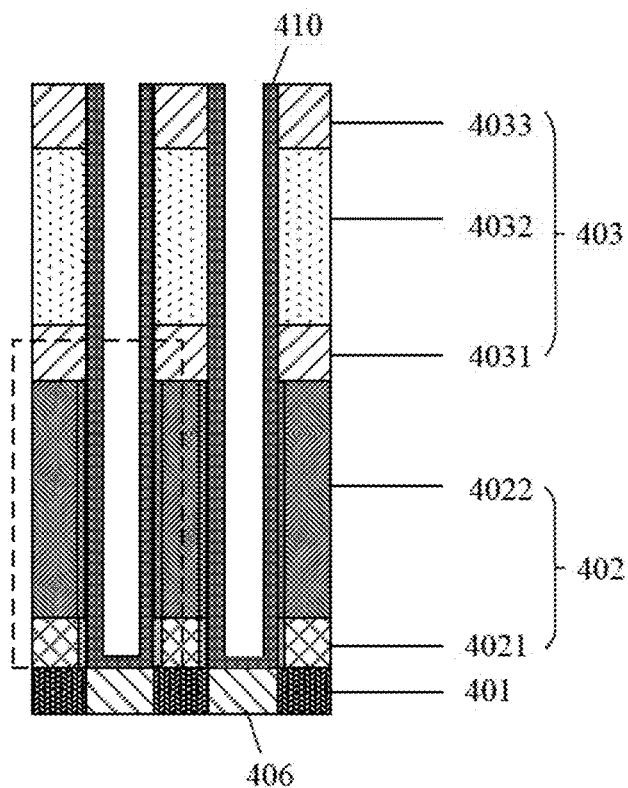
Figure 4H:
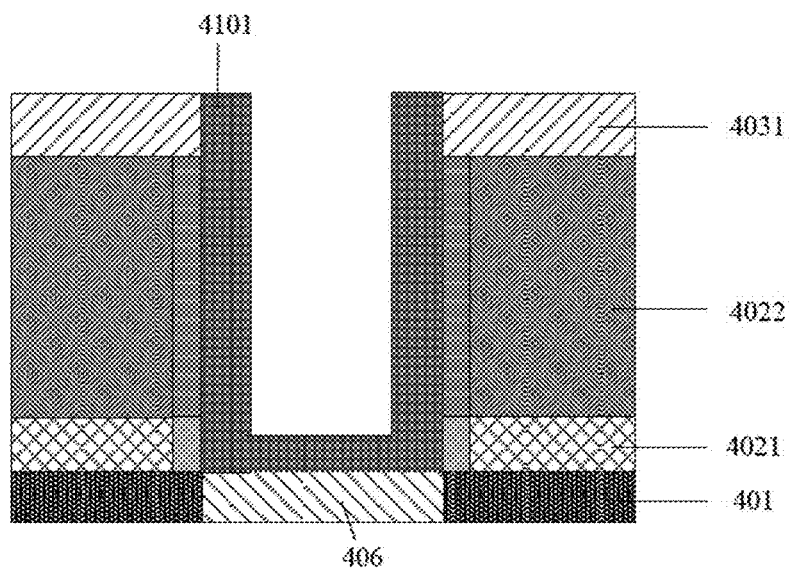

Next, referring to FIG. 4G and FIG. 4H, after the second etch residue is removed, a storage cell 410 is formed in the first groove 405. Here, the storage cell 410 is used for storing data.

Exemplarily, the storage cell 410 includes a capacitor or other storage cells, such as a phase change storage cell, a ferroelectric storage cell, a resistive storage cell, etc.

Taking the storage cell 410 being a capacitor as an example, the storage cell being formed in the first groove 405 is described in detail.

In some embodiments, referring to FIG. 4G and FIG. 4H, the method may also include the following operations.

After the second etch residue is removed, a first conductive layer 4101 is formed in the first groove 405, the first conductive layer 4101 covering the side wall and bottom of the first groove 405.

Part of the first dielectric layer 402 and part of the second dielectric layer 403 are removed.

A dielectric layer 4102 covering the first conductive layer 4101 is formed.

A second conductive layer 4103 covering the dielectric layer 4102 is formed.

Here, the first conductive layer 4101 is used as the lower electrode of the capacitor, the dielectric layer 4102 is used as the dielectric medium of the capacitor, and the second conductive layer 4103 is used as the upper electrode of the capacitor.

In some specific embodiments, materials for forming the first conductive layer 4101 and materials for forming the second conductive layer 4103 may include, but are not limited to, ruthenium (Ru), ruthenium oxide (RuO) and titanium nitride (TiN). Materials for forming the dielectric layer 4102 include a material with high dielectric constant (high-K), which generally refers to the material with the dielectric constant higher than, and usually significantly higher than, 3.9. In some specific examples, the materials for forming the dielectric layer 4102 may include, but are not limited to, aluminum oxide ($Al_2O_3$), zirconium oxide (ZrO), hafnium oxide ($HfO_2$), strontium titanate ($SrTiO_3$) etc.

In the embodiments of the present disclosure, referring to FIG. 4G, the first conductive layer 4101 may be formed on the side wall and bottom of the first groove 405 by the deposition process.

Exemplarily, the deposition process includes, but is not limited to, PVD, CVD, etc.

It is to be noted that the middle area of the first conductive layer 4101 may be hollow based on the selection of process conditions, that is, the first conductive layer 4101 is of U-shaped structure, referring to FIG. 4H.

Here, FIG. 4H is an enlarged view of the area corresponding to the dotted box in FIG. 4G.

Figure 4I:
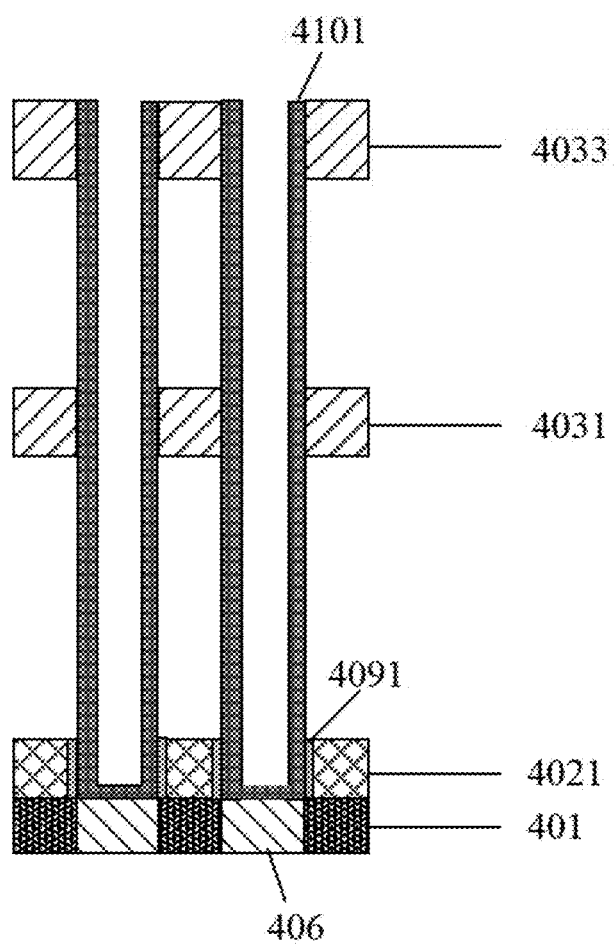

Referring to FIG. 4I, the first dielectric layer 402 and the sacrificial layer 4032 in the second dielectric layer 403 are removed; and the bottom dielectric layer 401, the first dielectric sublayer (the bottom support layer) 4021, part of the second protective layer (e.g. the third protective sublayer 4091), the middle support layer 4031, the top support layer 4033 and the first conductive layer 4101 are remained.

Figure 4J:
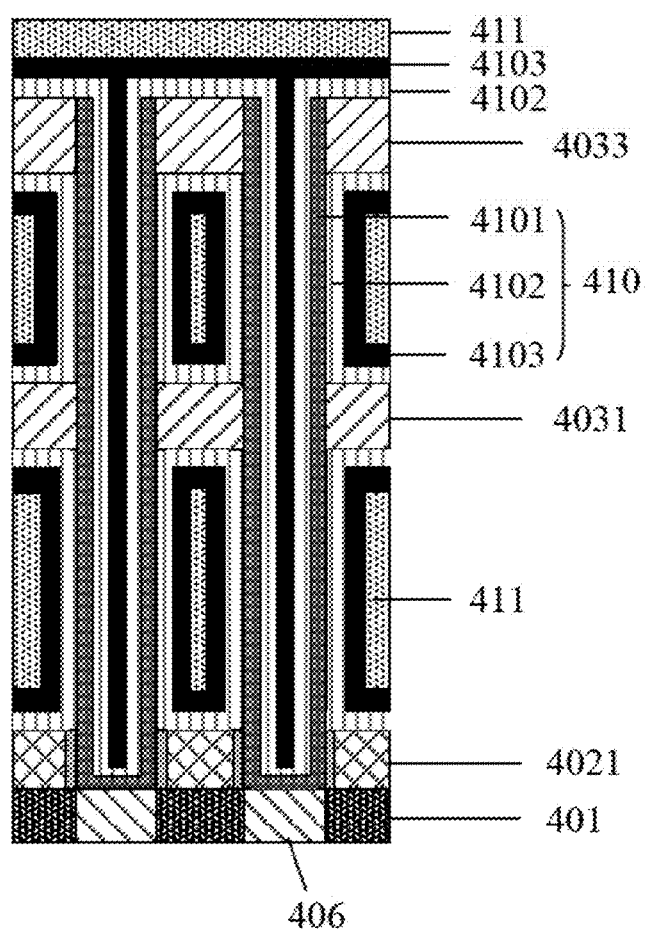

Referring to FIG. 4J, the dielectric layer 4102 is formed on each of surfaces of two sides of the first conductive layer 4101.

Exemplarily, the methods for forming the dielectric layer 4102 include, but are not limited to, PVD, CVD, ALD, etc.

It is to be noted that, in some specific embodiments, the dielectric layer 4102 covers not only the exposed surface of the first conductive layer 4101, but also the exposed surfaces of the support layers (4021, 4031 and 4033), referring to FIG. 4J.

Next, the second conductive layer 4103 is formed on the surface of the dielectric layer 4102. Here, the methods for forming the second conductive layer 4103 include, but are not limited to, PVD, CVD, etc.

Referring to FIG. 4J, in order to increase the reliability of the semiconductor structure, a fill layer 411 is formed in each of other gap areas of the storage cell 410. Here, the fill layer 411 may also be used together with the second conductive layer 4103 as the upper electrode of the capacitor.

Here, materials for forming the fill layer 411 include, but are not limited to, polysilicon, silicon germanium, etc.

Methods for forming the fill layer 411 include, but are not limited to, PVD, CVD, ALD, etc.

It is to be noted that, in some other embodiments, because the diameter width of the first groove 405 is small, the requirements on the process conditions are high. Based on this, the first conductive layer, the dielectric layer and the second conductive layer may also be formed in another way, referring to FIG. 5A, FIG. 5B, FIG. 5C, FIG. 5D and FIG. 5E.

Figure 5A:
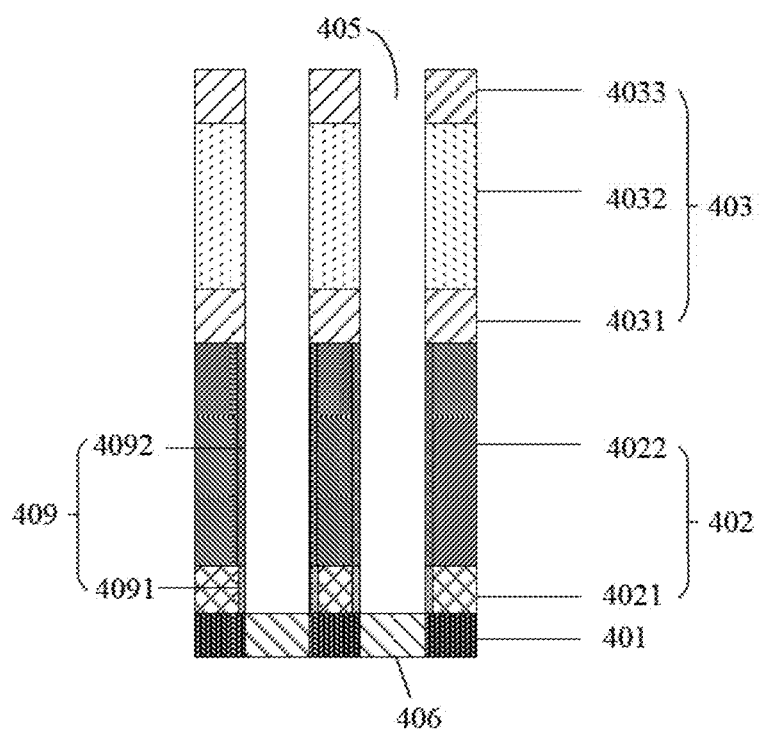
FIG. 5A to FIG. 5E are section diagrams illustrating a manufacturing process of another capacitor provided in an embodiment of the present disclosure.

Referring to FIG. 5A, after the second etching process, the second protective layer 409 is formed on the side wall, at the first dielectric layer 402, of the first groove 405. The third protective sublayer 4091 is formed on the side wall of the first dielectric sublayer (the bottom support layer) 4021. The fourth protective sublayer 4092 is formed on the side wall of the second dielectric sublayer 4022.

Next, the second etch residue in the first groove 405 is removed by cleaning.

Figure 5B:
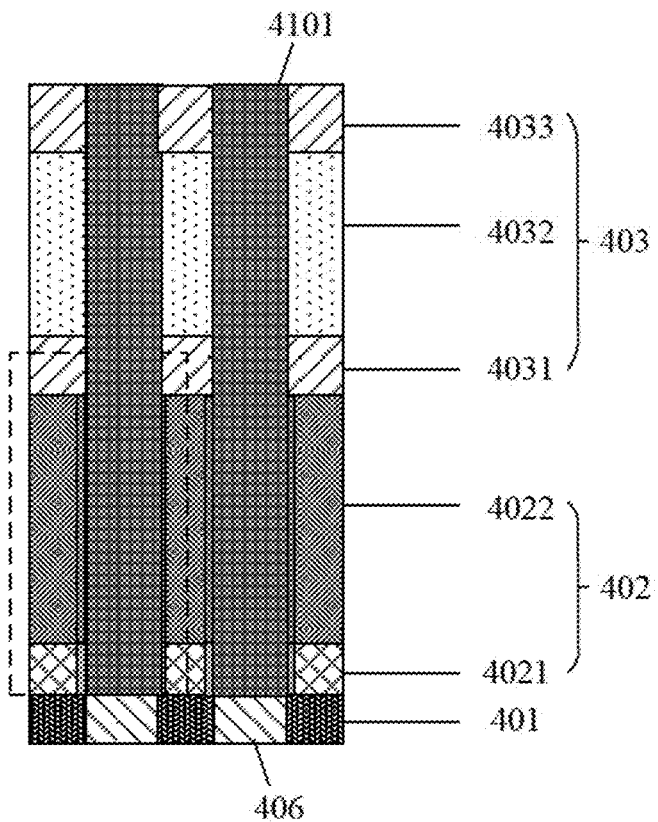

As illustrated in FIG. 5B, after the second etch residue is removed, the first conductive layer 4101 is formed in the first groove 405, the first conductive layer 4101 covering the side wall and bottom of the first groove 405. The first groove 405 is filled with the first conductive layer 4101 which is solid.

Figure 5C:
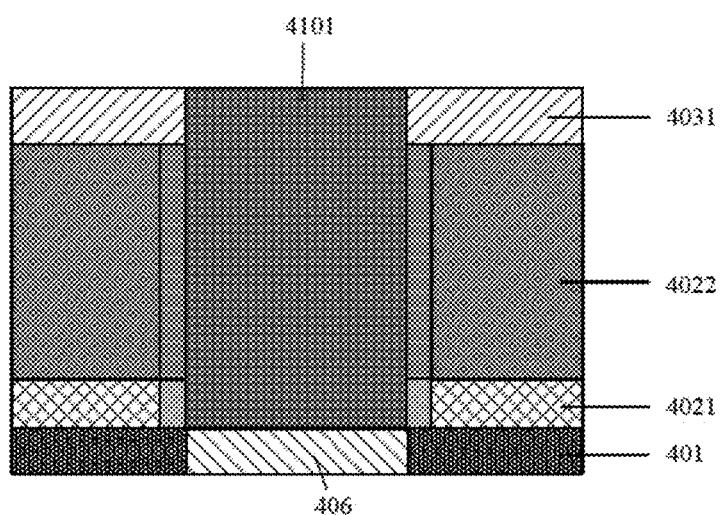

Here FIG. 5C is an enlarged view of the area corresponding to the dotted box in FIG. 5B.

Figure 5D:
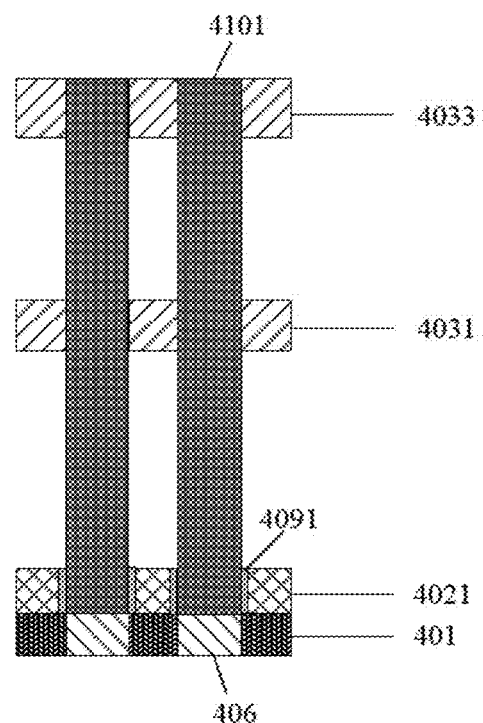

As illustrated in FIG. 5D, the second dielectric sublayer 4022, the fourth protective sublayer 4092 and the sacrificial layer 4032 in the second dielectric layer 403 are removed; and the bottom dielectric layer 401, the first dielectric sublayer (the bottom support layer) 4021, part of the second protective layer (e.g. the third protective sublayer 4091), the middle support layer 4031, the top support layer 4033 and the first conductive layer 4101 are remained.

Figure 5E:
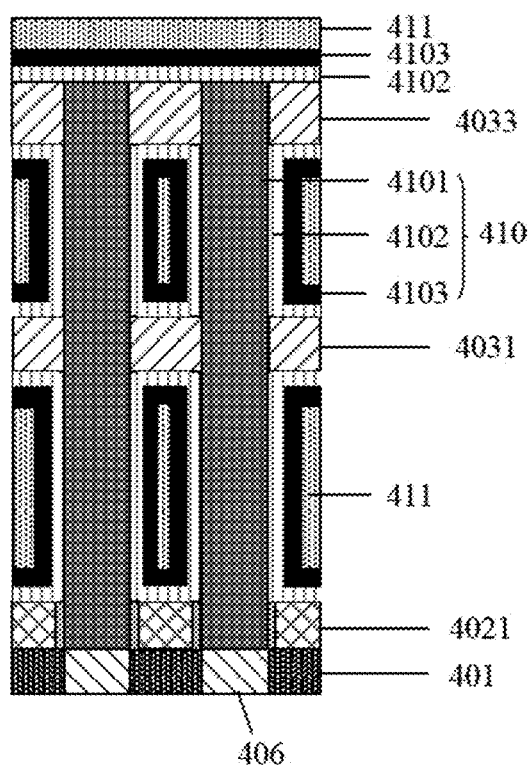

As illustrated in FIG. 5E, the dielectric layer 4102 is formed on each of the surfaces of two sides of the first conductive layer 4101; and the second conductive layer 4103 is formed on the surface of the dielectric layer 4102.

In some specific embodiments, Table 1 shows the etch amounts (EAs) of the upper area, the middle area and the lower area of the second dielectric sublayer 4022 (BPSG) cleaned with different cleaning solutions (the DSP or DHF solution) when the first protective layer 407 is not provided in the first groove 405 and the first protective layer 407 is provided in the first groove 405 respectively.

TABLE 1

| BPSG | The first protective layer is not provided | | The first protective layer is provided | |
|---|---|---|---|---|
| | DSP EA (nm) | DHF EA (nm) | DSP EA (nm) | DHF EA (nm) |
| Lower area | 2.2 | 2.4 | 0.4 | 0.5 |
| Middle area | 1.1 | 1.4 | 0.3 | 0.5 |
| Upper area | 0.6 | 0.9 | 0.4 | 0.5 |

It can be seen from Table 1 that the EAs of the cleaning solutions on the second dielectric sublayer 4022 are basically the same (that is, the amounts of removal are basically the same), so that the upper and lower diameter widths of the first groove 405 are basically the same.

Based on this, in each embodiment of the present disclosure, after the first groove penetrating through the first dielectric layer is formed, the first etch residue is formed in the first groove. Here, after the first protective layer is formed on the side wall, at the first dielectric layer, of the first groove, the first etch residue in the first groove is cleaned, so that the first protective layer can prevent the first dielectric layer from contacting a cleaning solution in a cleaning process, avoiding the chemical reaction between the cleaning solution and the first element in the first dielectric layer, and then protecting the side wall, at first dielectric layer, of the first groove from being damaged. In this way, upper and lower diameter widths of the first groove can be basically the same, so that the shape preserving ability of the storage cell formed in the first groove is improved, that is, the electrical performance of the storage cell is also improved, and thus the reliability of the memory is also improved.

According to another aspect of the present disclosure, the embodiments of the present disclosure provide a semiconductor structure, which may include: a substrate, multiple support layers, protective layers and storage cells.

The multiple support layers are located on the substrate and stacked and arranged at intervals in a first direction. Each of the support layers is provided with multiple through holes arranged according to a preset arrangement, and orthographic projections of corresponding through holes in the different support layers in the first direction overlap with each other.

The protective layers each are located on a part of a side wall of each of the through holes in the multiple support layers.

The storage cells are located in the through holes and penetrate through the multiple support layers.

The first direction is perpendicular to the surface of the support layer.

In some embodiments, the protective layer has a smooth and continuous side.

In some embodiments, materials for forming the protective layer include silicon nitride or silicon oxynitride.

In some embodiments, the multiple support layers include a bottom support layer, a middle support layer and a top support layer stacked and arranged at intervals in the first direction. The protective layer is at least on the side wall of the through hole in the bottom support layer.

In some embodiments, the storage cell includes a first conductive layer, a dielectric medium layer and a second conductive layer.

The first conductive layer is in the through hole and in contact with the substrate.

The dielectric medium layer covers the surface of the first conductive layer.

The second conductive layer covers the surface of the dielectric layer.

According to yet another aspect of the present disclosure, the embodiments of the present disclosure provide a memory, which includes: the semiconductor structure in any of the above embodiments of the present disclosure and a transistor array on the surface, of the substrate. The storage cells in the semiconductor structure are connected to the transistor array.

It is to be noted that the shape of the gate varies in different types of transistors. Exemplarily, in a columnar gate transistor, the gate is formed at one side of the channel area in a columnar form; in a gate half around transistor, the gate half surrounds the channel area; and in a Gate All Around (GAA) transistor, the gate completely surrounds the channel area.

The types of transistors in the embodiments of the present disclosure pray include, but are not limited to, many above types.

In each embodiment of the present disclosure, after a first groove penetrating a through first dielectric layer is formed, a first etch residue is formed in the first groove. Here, after a first protective layer is formed on the side wall at the first dielectric layer of the first groove, the first etch residue in the first groove is cleaned, so that the first protective layer can prevent the first dielectric layer from contacting a cleaning solution in a cleaning process, avoiding the chemical reaction between the cleaning solution and the first element in the first dielectric layer, and then protecting the side wall at first dielectric layer in the first groove from being damaged. In this way, upper and lower diameter widths of the first groove can be basically the same, so that the shape preserving ability of a storage cell formed in the first groove is improved, that is, the electrical performance of the storage cell is also improved, and thus the reliability of a memory is also improved.

In some embodiments provided by the disclosure, it is to be understood that the disclosed device and method may be implemented in a non targeted manner. The device embodiment described above is only schematic, and for example, division of the units is only logic function division, and other division manners may be adopted during practical implementation. For example, multiple units or components may be combined or integrated into another system, or some characteristics may be neglected or not executed. In addition, the components shown or discussed may be coupled or directly coupled to each other.

The units described as separate parts may or may not be physically separated, and parts shown as units may or may not be physical units, and namely may be located in the same place, or may also be distributed to multiple network units. Part of all of the units may be selected according to a practical requirement to achieve the purposes of the solutions of the embodiments.

The characteristics disclosed in some method or device embodiments provided in the present disclosure may be freely combined without conflicts to obtain new method embodiments or device embodiments.

The above description is only the specific implementation modes of the disclosure and not intended to limit the protection scope of the disclosure. Any change or replacement that those skilled in the art can think of easily in the scope of technologies disclosed by the disclosure shall fall within the protection scope of the disclosure. Therefore, the scope of protection of the disclosure shall be subject to the scope of protection of the claims.

What is claimed is:

1. A method for manufacturing a semiconductor structure, comprising:
   providing a stack structure comprising a first dielectric layer containing a first element;
   forming a pattern transfer layer on the stack structure, wherein the pattern transfer layer serves as a mask for a first etching process performed on the stack structure;
   forming a first groove at least penetrating through the first dielectric layer by the first etching process, wherein after the first etching process, a first etch residue is formed in the first groove;
   forming a first protective layer covering a side wall, at the first dielectric layer, of the first groove; and
   performing a first cleaning on the stack structure formed with the first protective layer to remove the first etch residue;
   removing the pattern transfer layer by a second etching process, after removing the first etch residue, wherein after the second etching process, a second etch residue is formed in the first groove;
   forming a second protective layer covering the side wall, at the first dielectric layer, of the first groove, after the second etching process; and
   performing a second cleaning on the stack structure formed with the second protective layer to remove the second etch residue;
   wherein the first groove is configured for forming a storage cell.

2. The method for manufacturing the semiconductor structure of claim 1, wherein forming at least one of the first protective layer or the second protective layer comprises:
   performing a first preprocessing on the first groove using a first cleaning agent, before performing the cleaning, so as to generate at least one of a first intermediate protective layer or a second intermediate protective layer on a surface of the first dielectric layer; and
   performing a second preprocessing on the first groove formed with the at least one of the first intermediate protective layer or the second intermediate protective layer using plasma containing a second element, so that the at least one of the first intermediate protective layer or the second intermediate protective layer is changed into at least corresponding one of the first protective layer or the second protective layer.

3. The method for manufacturing the semiconductor structure of claim 2, wherein the first element comprises boron; the first cleaning agent comprises Caro's acid solution or deionized water whose temperature is higher than a preset temperature; and the second element comprises nitrogen.

4. The method for manufacturing the semiconductor structure of claim 2, wherein the first dielectric layer comprises a first dielectric sublayer for forming a bottom support layer and a second dielectric sublayer located on the first dielectric sublayer; correspondingly, the first protective layer comprises a first protective sublayer and a second protective sublayer, and the second protective layer comprises a third protective sublayer and a fourth protective sublayer;
   forming the at least one of the first protective layer or the second protective layer comprises:
   forming at least one of the first protective sublayer or the third protective sublayer covering the first dielectric sublayer in the side wall of the first groove, and forming at least one of the second protective sublayer or the fourth protective sublayer covering the second dielectric sublayer in the side wall of the first groove.

5. The method for manufacturing the semiconductor structure of claim 4, wherein materials for forming the first dielectric sublayer comprise silicon boron nitrogen, materials for forming the second dielectric sublayer comprise boron-phosphorosilicate glass, materials for forming at least one of the first protective sublayer or the third protective sublayer comprise silicon nitride, and materials for forming at least one of the second protective sublayer or the fourth protective sublayer comprise silicon oxynitride.

6. The method for manufacturing the semiconductor structure of claim 1, wherein the stack structure further comprises: a second dielectric layer between the first dielectric layer and the pattern transfer layer; the first groove also penetrates through the second dielectric layer; and the second dielectric layer is configured for forming a middle support layer and a top support layer; the method further comprises:
   forming in the first groove a first conductive layer covering a side wall and a bottom of the first groove, after removing the second etch residue;
   removing a part of the first dielectric layer and a part of the second dielectric layer;
   forming a dielectric medium layer covering the first conductive layer; and
   forming a second conductive layer covering the dielectric medium layer.

7. The method for manufacturing the semiconductor structure of claim 1, wherein materials for forming the pattern transfer layer comprise polysilicon.

* * * * *